United States Patent
Hsu et al.

(10) Patent No.: US 7,242,243 B2
(45) Date of Patent: Jul. 10, 2007

(54) VOLTAGE-CONTROLLED CAPACITOR CIRCUIT AND RELATED CIRCUITRY WITH DIODE AND MOS VARACTORS

(75) Inventors: Kung-Yu Hsu, Tao-Yuan (TW); Chih-Hung Cheng, Taipei (TW)

(73) Assignee: AMIC Communication Corporation, Hsin-Chu (TW)

( * ) Notice: Subject to any disclaimer, the term of this patent is extended or adjusted under 35 U.S.C. 154(b) by 1051 days.

(21) Appl. No.: 10/064,355

(22) Filed: Jul. 4, 2002

(65) Prior Publication Data

US 2003/0202313 A1    Oct. 30, 2003

(30) Foreign Application Priority Data

Apr. 25, 2002    (TW) ................ 91108587 A

(51) Int. Cl.
*H01L 29/93*    (2006.01)
(52) U.S. Cl. ................ 327/586; 327/596; 331/177 V
(58) Field of Classification Search ............... 327/586, 327/596; 331/177 V
See application file for complete search history.

(56) References Cited

U.S. PATENT DOCUMENTS 6,225,861 B1*    5/2001    Kawai .................... 327/586

FOREIGN PATENT DOCUMENTS

TW    251757    7/1995

* cited by examiner

*Primary Examiner*—Kenneth B. Wells
(74) *Attorney, Agent, or Firm*—Winston Hsu

(57) ABSTRACT

A voltage-controlled capacitor circuit and related circuitry. The voltage-controlled capacitor circuit includes a metal-oxide semiconductor (MOS) varactor, a diode varactor, and/or a capacitor with fixed capacitance. The MOS varactor, the diode varactor and the capacitor are electrically connected in parallel or in series to form a capacitor with a preferred characteristic of voltage-controlled capacitance.

17 Claims, 9 Drawing Sheets

VOLTAGE-CONTROLLED CAPACITOR CIRCUIT AND RELATED CIRCUITRY WITH DIODE AND MOS VARACTORS

BACKGROUND OF INVENTION

1. Field of the Invention

The invention relates to a voltage-controlled capacitor circuit and related circuitry, and more particularly, to a metal-oxide semiconductor (MOS) varactor and a diode varactor to form a capacitor with preferred a characteristic of voltage-controlled capacitance and other circuits with related applications.

2. Description of the Prior Art

In modern information business, all kinds of data, information, video, and so on are all transmitted electronically; therefore, a processing circuit for dealing with electronic signals becomes the most important foundation of modern information business. For example, in common information systems (such as a personal computer), a global clock is required to coordinate all digital circuits in the system, so an oscillator for generating clock is an indispensable circuit block for modern digital circuits. In addition, to synchronize circuits with different clocks, phase loop lock (PLL) circuits are needed, and a precise voltage-controlled oscillator (VCO) is essential for the PLL to generate different frequencies of signals. Furthermore, in some precise filters, resister-capacitor (RC) filters, in which filter frequency can be adjusted, are utilized frequently.

With filter characteristics of an RC filter and the oscillation characteristic of an LC oscillator, it is possible to adjust each of them by modifying the capacitance value. Please refer to FIG. 1. FIG. 1 is a schematic diagram of a prior art VCO10. The VCO10 has a pair of coupled MOS transistors T1, T2 to form an oscillation circuit, and voltage Vd biases the VCO10. The gate electrodes of T1 and T2 are input ends of the VCO, and are connected electrically with nodes NP2 and NP1 separately. The drain electrodes of T1, T2 are output ends of the VCO, and are electrically connected to Np1 and Np2 separately. A current source Ip0 that is electrically connected to the source electrodes of transistor T1 and T2 provides current for the circuit. And a pair of coupled diodes Dp1 and Dp2 serve as varactors, and their cathodes are electrically connected to nodes Np1 and Np2. Their anodes being controlled by the voltage Vc0 makes these two diodes Dp1 and Dp2 reversed-biased, and results in a depletion region in the PN-junctions of each of them. This will make Dp1 and Dp2 form an equivalent capacitor between each of their anodes and cathodes. The capacitors provided by the diode Dp1 and Dp2 can form an LC tank with a pair of coupled inductors Lp1 and Lp2. The capacitor provided by the diode Dp1 and the inductor Lp1 can be regarded as the load of the transistor T1. If the transistor T1 receives an input oscillation signal from its gate electrode and outputs the signal through Np1 to the load, it is equivalent to modifying the phase of the input oscillation signal. The input oscillation signal enters the gate electrode of the transistor T2 through node Np1 after being phase-modified by the transistor T2 again, and from node Np2 it will feedback to the transistor T1 once again. According to the feedback mechanism mentioned above, it will produce a periodical oscillation signal at nodes Np1 and Np2.

Since the VCO10 deploys the LC circuit to generate a resonant signal, the frequency of the resonant frequency is proportional to $1/\sqrt{L0 \cdot C0}$; where L0 is the inductance value of the inductors Lp1 and Lp2, and C0 is the equivalent capacitance value of the diodes Dp1 and Dp2. In VCO10, the diodes Dp1 and Dp2 serve as voltage-controlled varactors. The capacitance of the varactors can be simply modified by changing the voltage across the anode and the cathode. Furthermore, changing the voltage means changing the resonant frequency of the VCO, and this will achieve the goal of voltage-controlled frequency. Please refer to FIG. 2A and FIG. 2B. FIG. 2A and FIG. 2B are schematic diagrams of the relationship between the voltage and the equivalent capacitor across the anode and the cathode when a diode is used as a varactor. When a diode D0 acts as an equivalent varactor, with a capacitance of Ca0 between Na1 (cathode) and Na2 (anode), a relationship between Va12 (the voltage across cathode and anode) and Ca0 is shown in FIG. 2A; where the X-axis is the voltage of Va12, and the Y-axis is the capacitance of Ca0. On the other hand, FIG. 2B shows a relationship between the reciprocal and square root of the capacitance of Ca0 and the voltage of the Va12. When the diode D0 is applied into LC-VCO, it is better for the circuit designer to linearly voltage-control the resonant frequency of the VCO. Since the resonant frequency is proportional to $1/\sqrt{Ca0}$, it represents that a linear relationship between the controlled-voltage and $1/\sqrt{Ca0}$ would be better. But as FIG. 2B shows, the voltage Va12 across the diode D0 does not show a reasonable linearity with $1/\sqrt{Ca0}$, and would be a problem when designing the circuit. Moreover, that the characteristic of a voltage-controlled-capacitor diode varactor is mostly decided by a semiconductor manufacturing process, which cannot be adjusted by the method of circuit design, makes it inflexible to be applied into circuit design.

In the prior art mentioned above, a diode is used as a varactor. Now that MOS processes have developed, MOS can now be used as a voltage-controlled varactor too. Please refer to FIG. 3, which is a schematic diagram of the voltage-controlled characteristic of a MOS when used as a varactor. The gate electrode of the MOS M0 form an end at node Nb1, the source and the drain electrodes of the transistor MO are both connected at node Nb2 to form another end. Then an equivalent capacitor Cb0 is formed between Nb1, Nb2, and M0. FIG. 3 is a relationship schematic diagram between the capacitance of Cb0 and the voltage of Vb12. Where the X-axis is the voltage of Vb12 and the Y-axis is the capacitance of the equivalent capacitor Cb0. As FIG. 3 shows, when the transistor M0 is a voltage-controlled varactor, the voltage-controlled characteristic of it becomes more sophisticated, and more non-linear. Though a small segment of the characteristic curve appears to be linear, it is too narrow to be flexibly used in circuit design.

SUMMARY OF INVENTION

It is therefore a primary objective of the claimed invention to provide a diode varactor, a MOS varactor, and a capacitor with fixed capacitance to synthesize a capacitor with various kinds of characteristics of voltage-controlled capacitance, and to meet all kinds of demands of a voltage-controlled capacitor used as a VCO and filter.

In the claimed invention, a diode varactor, MOS varactor, and standard capacitor (fixed capacitance) are connected in parallel or in series to compose various kinds of voltage-controlled characteristics of voltage controlled capacitance circuits. In addition, the voltage-controlled characteristic can be adjusted by biases or by different fixed-capacitors in order to accomplish different characteristics of voltage-controlled capacitors.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 4:
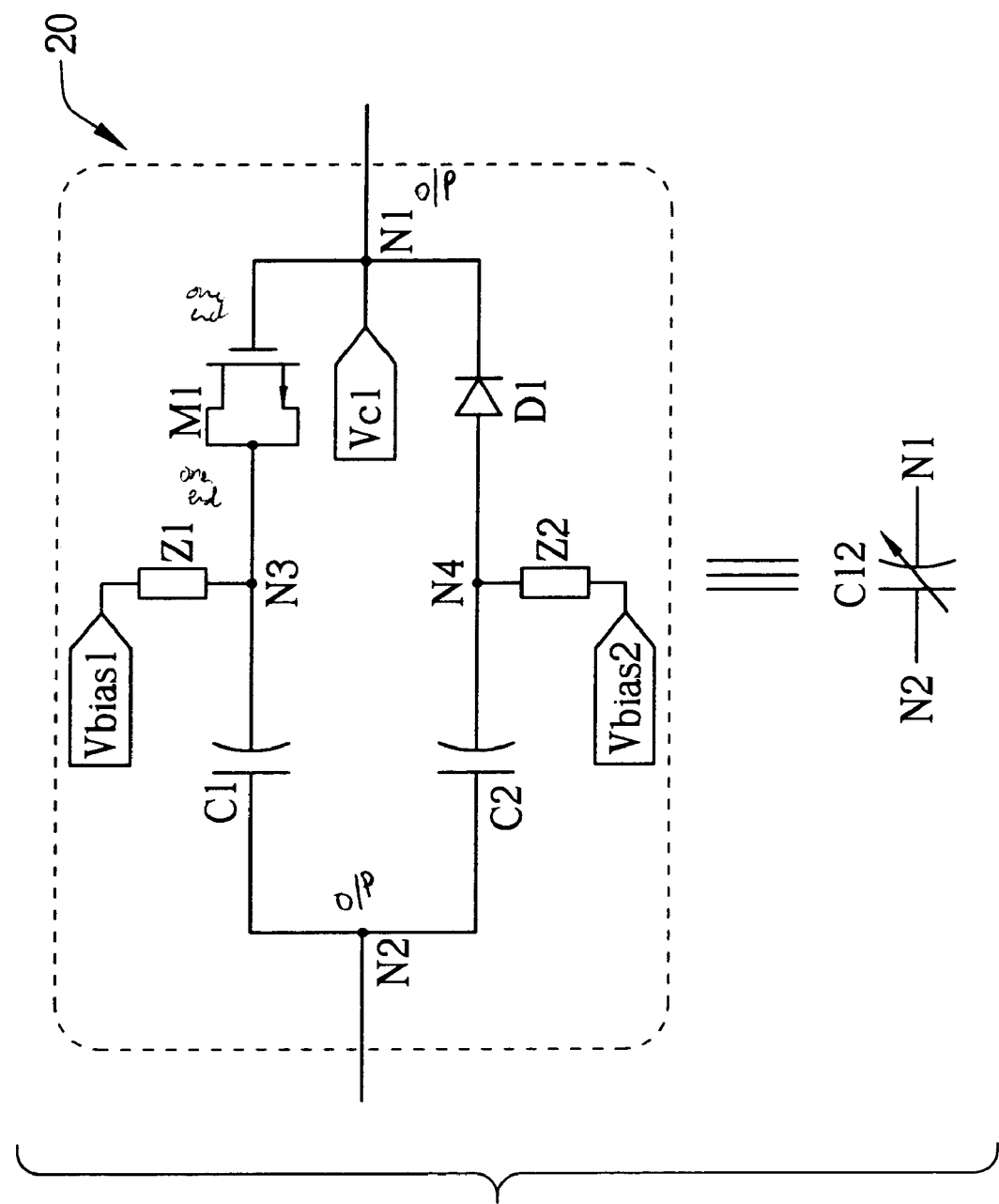
FIG. 4 is a schematic diagram of a voltage-controlled capacitor circuit of one embodiment of the present invention.

Please refer to FIG. 4, which is a schematic diagram of a voltage controlled capacitor circuit 20 in the present invention. In this embodiment, the voltage controlled capacitor circuit 20 takes nodes N1 and N2 as its two outputs ends, and between these two ends, the voltage controlled capacitor circuit 20 can be taken as an equivalent voltage-controlled capacitor C12. The voltage controlled capacitor circuit 20 has a MOS M1, a diode D1, two fixed-capacitance capacitors C1 and C2, and coupled impedances Z1 and Z2 for coupling the voltage biases Vbias1 and Vbias2 with nodes N3 and N4. The MOS transistor M1 serves as a first varactor, and its gate electrode, which is an electrode of the first varactor, is electrically connected with node N1. The source and the drain electrodes both electrically connect with node N3, and form another electrode of the first varactor. Similarly, the diode D1 provides a PN-junction as a second varactor, and its anode, which is one electrode of the second varactor, is electrically connected to node 14. As mentioned above, with the first varactor, which is based on the MOS transistor M1, the voltage across its two electrodes can control its capacitance. The voltage bias Vbias1 inputted from node N3 and the control voltage Vc1 inputted from node N1 can control the equivalent capacitance of the first varactor between nodes N1 and N3. Equally, the control voltage Vc1 inputted from node N1 and the voltage bias Vbias2 inputted from node N4 can control the equivalent capacitance of the second varactor between nodes N1 and N4. For convenient controlling, the Vbias1 and Vbias2 in the present invention can be a fixed number, so that it is possible to control the capacitances of two varactors merely modifying the control voltage Vc1. The coupled impedances for coupling the voltage bias Vbias1 and Vbias2 to nodes N3 and N4 can be either inductors or resistors. Since the voltage biases Vbias1 and Vbias2 are DC voltages, coupled impedance in the form of inductances can couple the voltage biases Vbias1 and Vbias2 to nodes N3 and N4 without disturbing the high-frequency AC signal in nodes N3 and N4. The fixed-capacitance capacitors C1 and C2 are separately electrically connected to nodes between N2 and N3 and between N2 and N4 in order to adjust the weight of the first and the second varactors. As shown in FIG. 4, the capacitor C12 provided by the voltage-controlled capacitor circuit 20 between nodes N1 and N2 is formed by the capacitor C1 connecting in series with the first varactor, the capacitor C2 connecting in series with the second varactor, and finally, connecting both of them in parallel. Therefore, modifying the capacitance of the capacitor C1 or C2 when designing the circuit can also change the degree to which the second varactor affects the capacitor C12. For example, raising the capacitance of the capacitor C1 will make the voltage-controlled characteristics of the capacitor C12 more like what the first varactor owns.

Figure 5:
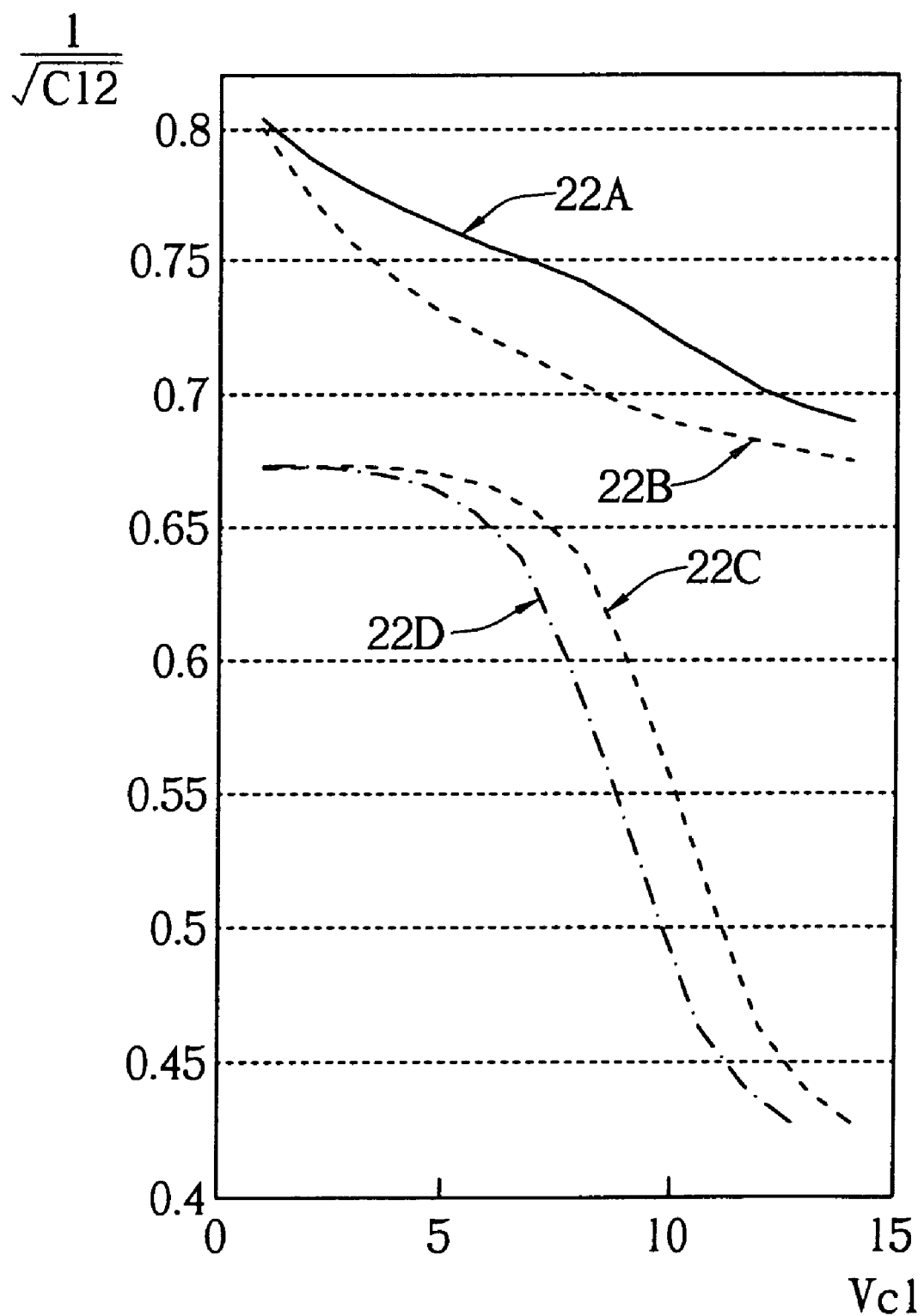
FIG. 5 is a schematic diagram of the voltage-controlled characteristics of the voltage-controlled capacitor circuit.

Please refer to FIG. 5, which is a schematic diagram of the voltage-controlled characteristics of the voltage-controlled capacitor circuit 20. The X-axis in FIG. 5 represents the voltage of the control voltage Vc1, and the Y-axis represents the reciprocal and the square root of the capacitance of the capacitor C12; the curve 22 depicts the function relationship between the control voltage Vc1 and the reciprocal and the square root of the capacitance of the capacitor C12. For easier comparison, the curves 22B and 22C separately depict the conditions that only the diode D1 or the MOS transistor M1 is included. To generate the curve 22A, which is the characteristic of the voltage-controlled capacitor from the voltage-controlled capacitor circuit 20, the following parameters can be adopted: the capacitance of the capacitor C1 is 4 pF, C2 is 1 Pf, the width and the length of the MOS transistor M1 is 300 μm and 1 μm, and the area of the diode is 100 μm$^2$. As shown in FIG. 5, when adopting only the MOS transistor or diode as a varactor, its characteristic curves will be curve 22B or curve 22C, and the non-linear part will be obvious enough to make it harder when designing a circuit. In the contrast, the voltage-controlled capacitor circuit 20 shows a better linearity when properly combining MOS and diode varactors, and it is more convenient to control the capacitor C12 provided by the voltage-controlled capacitor circuit 20. As mentioned above, when in LC-VCO, if the control voltage is proportional to $1/\sqrt{C}$, then it is possible to linearly voltage-control the resonant frequency. The voltage-controlled capacitor circuit 20 in FIG. 4 can be implemented into VCO to show the characteristic curve in FIG. 5. When voltage-controlling the voltage-controlled capacitor circuit 20, besides modifying the capacitors C1 and C2 and changing the weights of the first and second varactors, modifying the bias voltage can also shift the characteristics of the first and second varactors. For example, when the bias voltage of Vbias1 becomes greater, the characteristic curve of the first varactor will shift from 22C to 22D. Thus, combining both the characteristics of the first and second voltage-controlled capacitors will result in various characteristics of a voltage-controlled capacitor.

Figure 1:
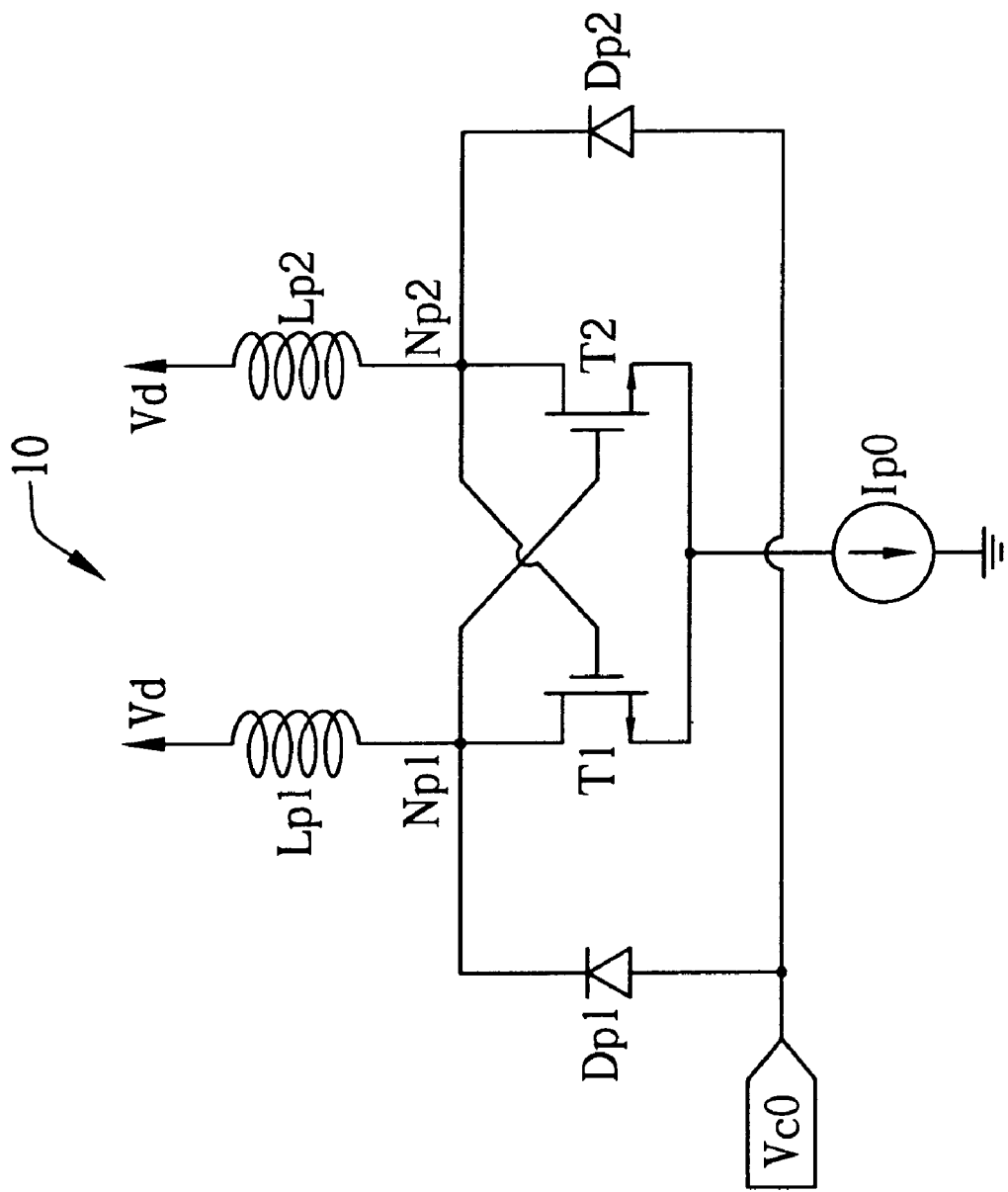
FIG. 1 is a schematic diagram of a prior art VCO.
Figure 2B:
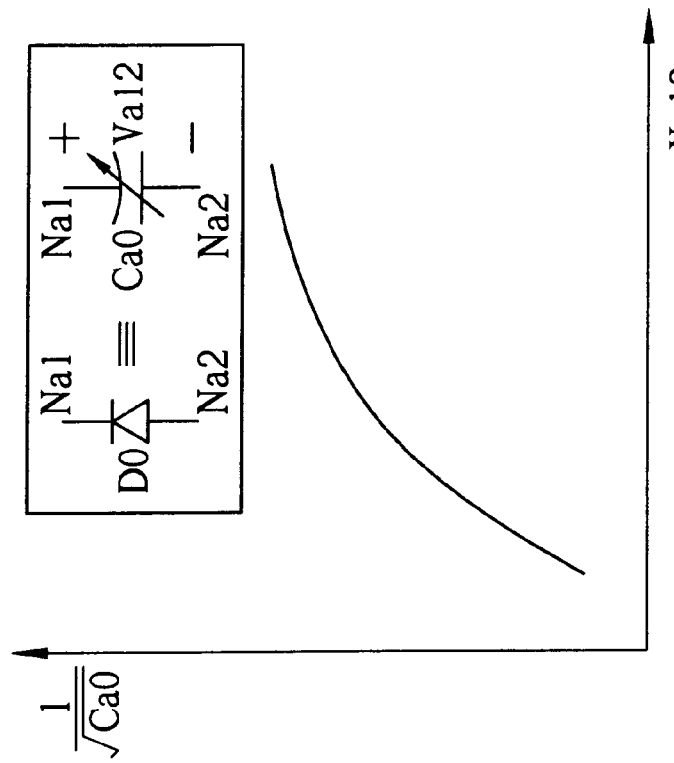
FIGS. 2A and 2B are schematic diagrams of prior art characteristics of voltage-controlled capacitors.
Figure 2A:
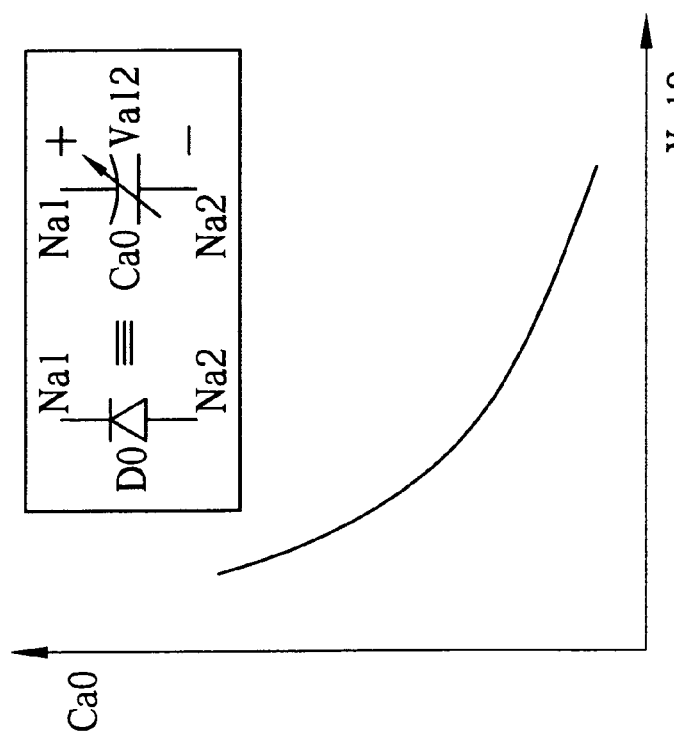
Figure 3:
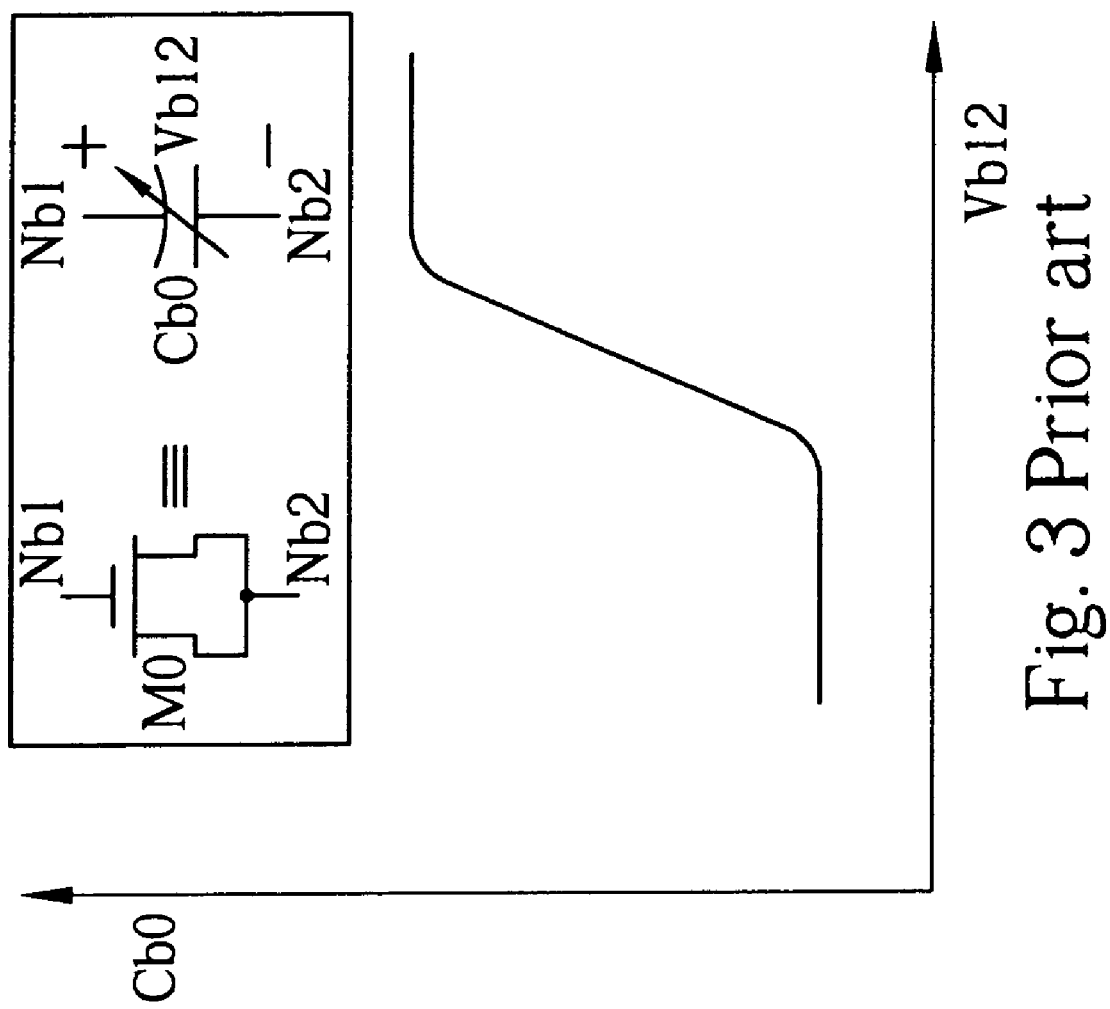
FIG. 3 is a schematic diagram of a prior art characteristic of a MOS transistor varactor.
Figure 6:
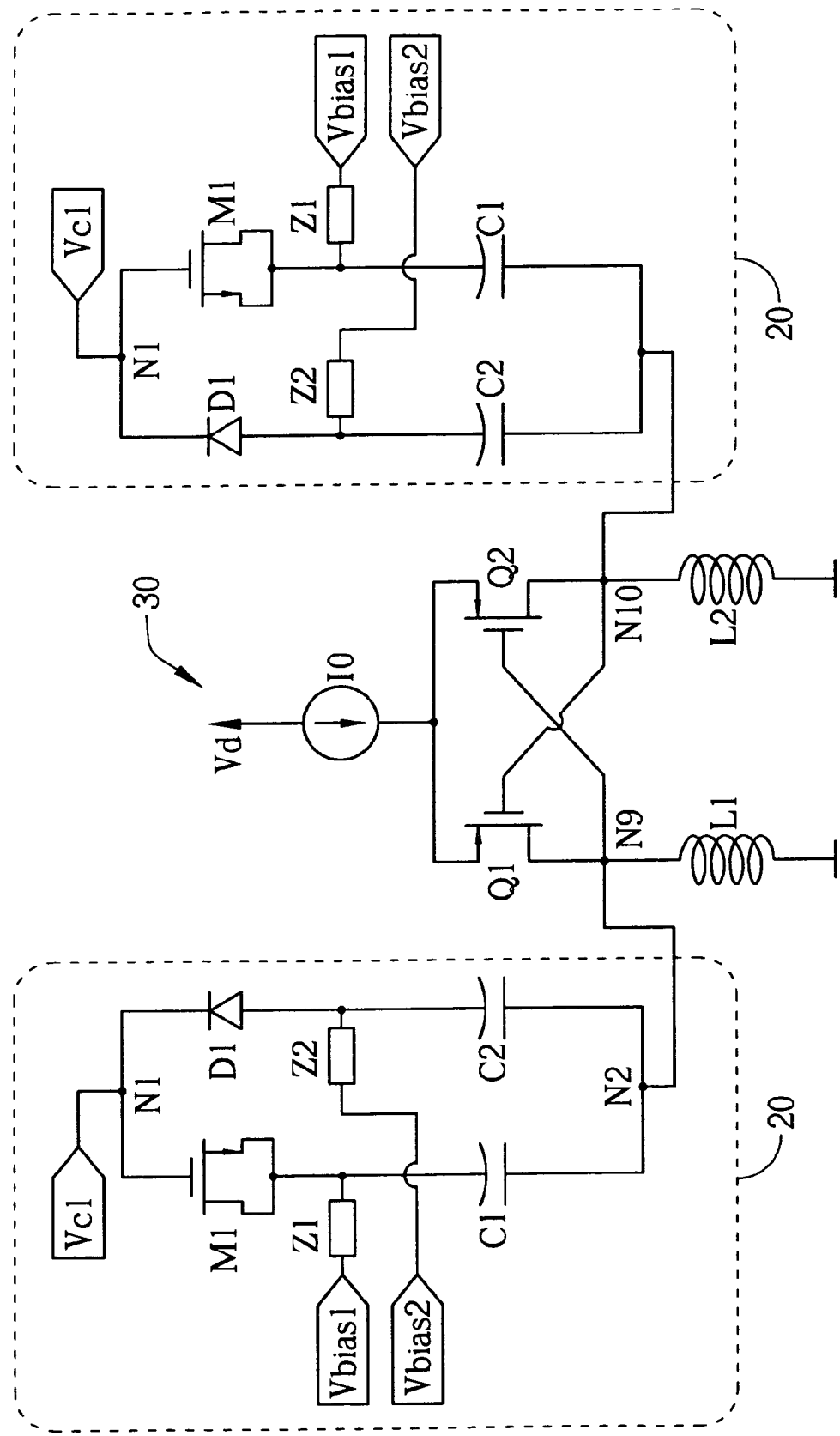
FIG. 6 is a schematic diagram of a voltage-controlled capacitor circuit applied in a VCO.
Figure 7:
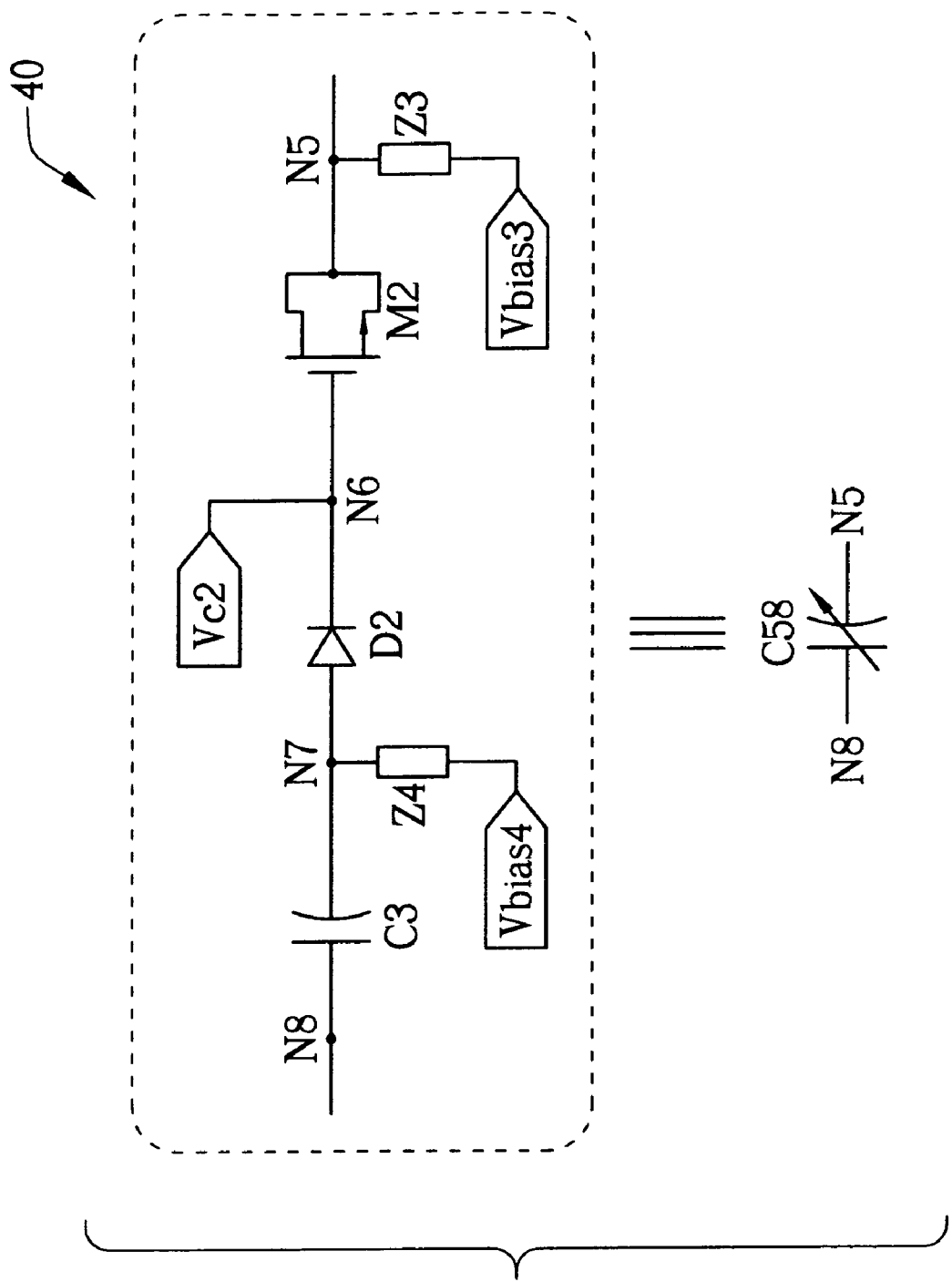
FIG. 7 is a circuit schematic diagram of a second embodiment of the voltage-controlled capacitor circuit.
Figure 8A:
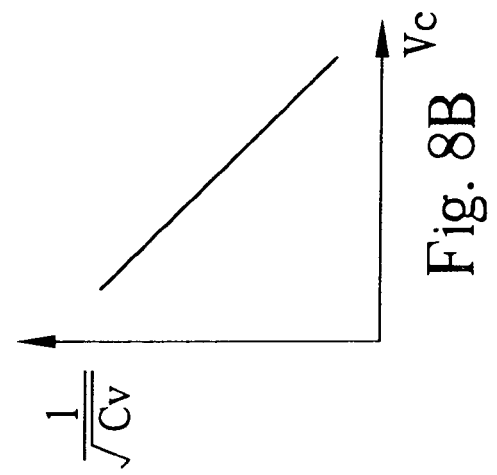
FIGS. 8A to 8D shows various characteristic diagrams of the voltage-controlled capacitor circuit.
Figure 8B:
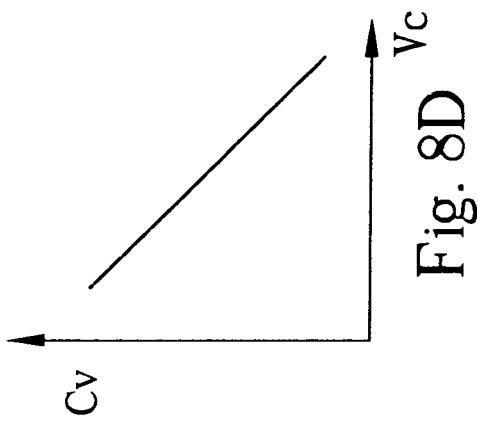
Figure 8C:
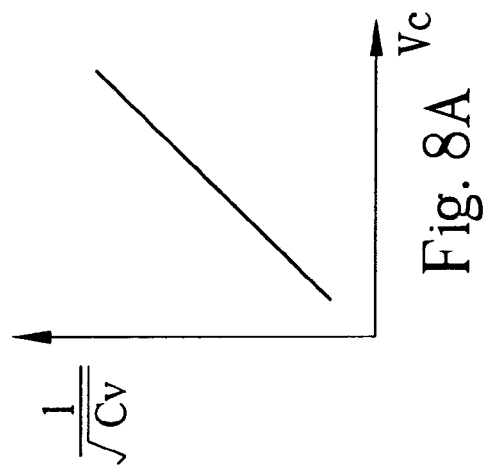
Figure 8D:
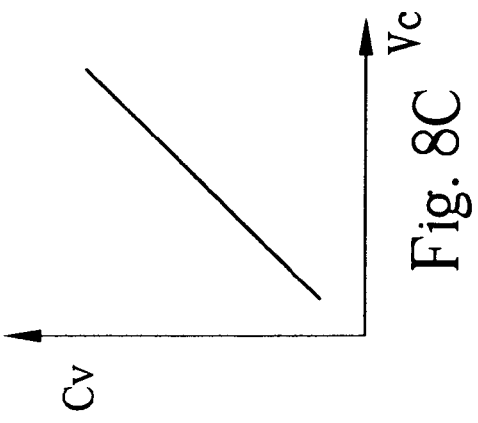

Please refer to FIG. 6, which is a schematic diagram of a voltage-controlled capacitor circuit 20 applied in an oscillator 30. The oscillator 30 is voltage-biased by the voltage source Vd, and current-biased by the current source 10. An oscillator circuit is formed by two MOS transistor Q1 and Q2, and an LC-Tank is formed by two equivalent capacitors and inductors generated by the voltage-controlled capacitors. The gate electrodes of the two MOS transistors Q1 and Q2 can be regarded as the input ends of the oscillation signals, and nodes N9 and N10 are the output ends. The oscillation signal inputted into the gate electrode of the MOS transistor Q1 would be outputted to the load of the LC-Tank, and inputted into the gate electrode of the MOS transistor Q2 through node N9. The MOS transistor Q2 modifies the phase of the oscillation signal again by the LC-Tank located in node N10, and feeds it back to the gate electrode of the MOS transistor Q1. With repeated feedback, a periodical oscillation signal is generated between nodes N9 and N10. As mentioned above, simply changing the voltage of the control voltage Vc1 can modify the capacitance of the voltage-controlled capacitor in order to modify the resonant frequency to achieve the purpose of VCO. Of course, the voltage-controlled circuit 20 in FIG. 4 can be also applied to the oscillator 10 in FIG. 1. Please refer to FIG. 7. FIG. 7 is another embodiment of the voltage-controlled capacitor circuit in the present invention. The voltage-controlled capacitor circuit 40 takes two nodes N5 and N8 as its two output ends. In voltage-controlled capacitor circuit 40, MOS transistor M2 serves as a first varactor, and the capacitance between nodes N5 and N6 are controlled by the control voltage Vc2 and the voltage bias Vbias3. The diode D2 is for a second varactor, and its capacitance between nodes N6 and N7 is controlled by the control voltage Vc2 and the voltage bias Vbias4. Finally, a fixed capacitor C3 is placed between nodes N7 and N8. By electrically connecting the first and second varactor and the capacitor C3 in series, the voltage-controlled capacitor circuit 40 can provide an equivalent capacitor 58 between nodes N5 and N8. Similar to the voltage-controlled capacitor circuit 20 in FIG. 4, the voltage-controlled capacitor circuit 40 can also fix the bias voltages of the Vbias3 and Vbias4 to control the capacitance of the first and the second varactor by controlling the voltage Vc2. The capacitor C3 is used for adjusting the contribution percentage of which the first and the second varactor contribute to the equivalent capacitor C58. For the voltage-controlled capacitor circuit 20 in FIG. 4, or the voltage-controlled capacitor circuit 40 in FIG. 7, for each it is possible to control the capacitance provided from the first and the second capacitor by controlling the bias voltage and the control voltage, and to adjust the weight of the first and the second varactor in every voltage-controlled capacitor circuit by applying the corresponding fixed-capacitance capacitor C1, C2, and C3. FIG. 5 shows the characteristic of the linear voltage-controlled capacitance between the control voltage Vc1 and $1/\sqrt{C12}$ by the combination with the first and the second varactor. In addition, it is also possible to generate other characteristics of voltage-controlled capacitor circuits by the voltage-controlled capacitor circuit revealed in the present invention. Please refer to FIG. 8A to FIG. 8D. The figures mentioned above show four examples of the characteristics of the voltage-controlled circuit that the voltage-controlled capacitor circuit in the present invention is able to generate. Each of the X-axes of the four figures represents the controlled-voltage Vc, and each of the Y-axes represents the capacitance provided by the voltage-controlled capacitor circuit. The characteristic of the voltage-controlled capacitor shown in FIG. 8A and FIG. 8B is the linear relationship between the reciprocal and the square root of the capacitance of Cv and the control voltage. The characteristic of the voltage-controlled capacitor shown in FIG. 8C and FIG. 8D is the linear relationship between the capacitance of Cv and the control voltage. In addition, the voltage-controlled capacitor circuit can also generate the linear relationship of voltage-controlled capacitor circuit between the control voltage Vc and $(Cv)^2$.

Figure 9:
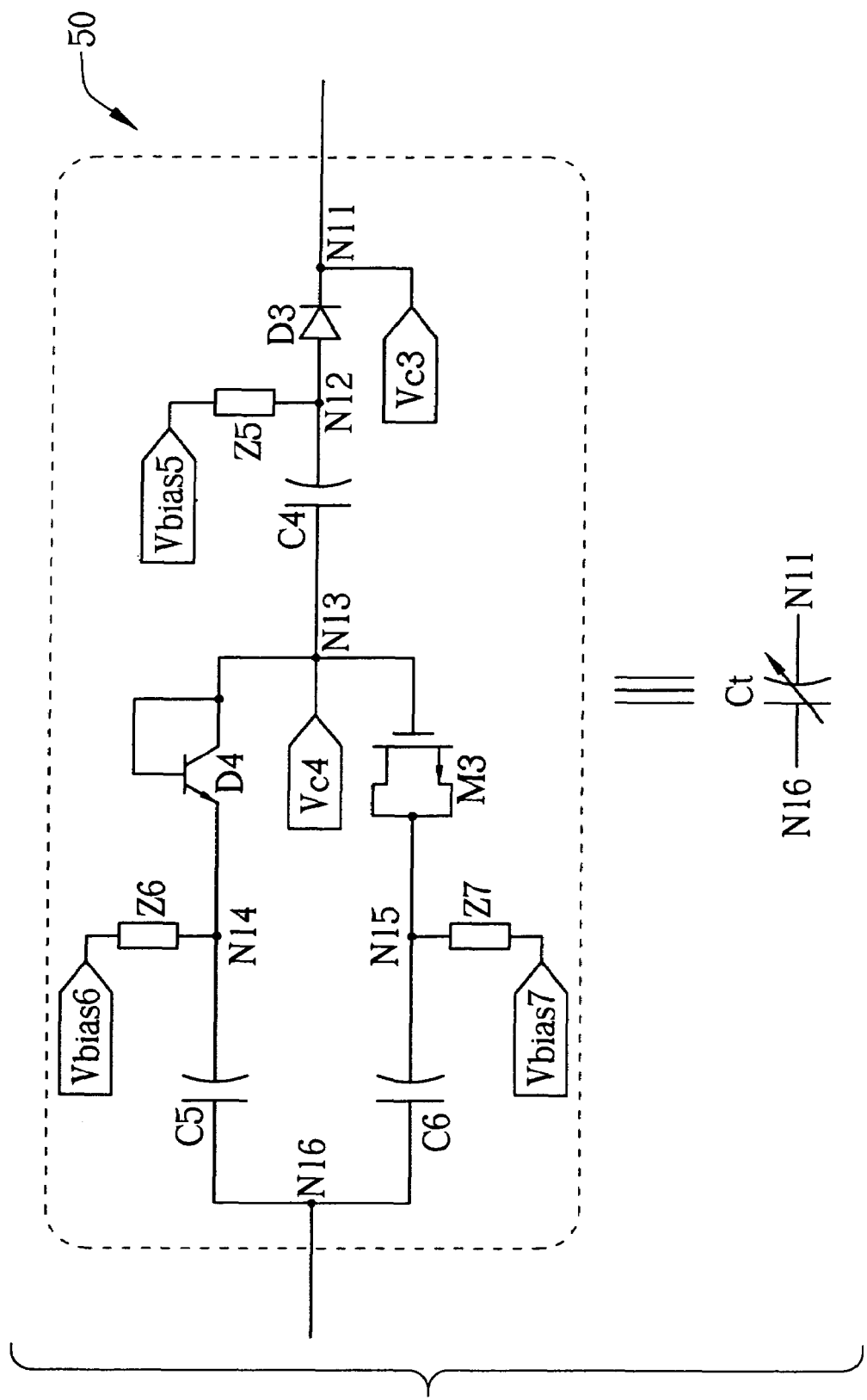
FIG. 9 is a circuit schematic diagram of a third embodiment of the voltage-controlled capacitor circuit.

Please refer to FIG. 9, which is a circuit diagram of the voltage-controlled capacitor circuit of another embodiment in the present invention. Besides deployment in parallel and in series, the invention also adopts both of them to generate different kinds of voltage-controlled capacitor circuits. In the voltage-controlled capacitor circuit 50 shown in FIG. 9, the MOD M3 and the two diodes D3, D4 are taken as the three varactors. The capacitors C4, C5, and C6 of fixed capacitance can be utilized to adjust the weight of the three combinations of varactors. Please note that the diode-connected BJT or MOS can be also taken as a PN-junction varactor in the present invention. Like the diode D4 in FIG. 9, it forms a diode-connected BJT. The voltage difference between the control voltage Vc3 inputted from node N11 and the voltage bias Vbias5 inputted from the coupled impedance Z5 can be applied to control the capacitance of D3 between nodes N12 and N11. Equally, the control voltage Vc4 inputted from node N13 and the voltage bias Vbias6 inputted from node N14 and the coupled impedance Z6, and the voltage bias inputted from node N15 and the coupled impedance Z7 can control the capacitance of the diode D4 and the MOS M3 providing between nodes N13 and N14, N13 and N15. Using all the varactors and the fixed-capacitance capacitors, the voltage-controlled capacitor circuit 50 is able to provide an equivalent circuit between nodes N11 and N16.

Moreover, it is not necessary to use a fixed-capacitance capacitor in the voltage-controlled capacitor circuit of the present invention. For example in FIG. 4, in the voltage-controlled capacitor circuit 20, the capacitors C1 and C2 can be skipped and nodes N3 and N4 can be directly connect to node N2. Likewise, the voltage biases Vbias1 and Vbias2 can also be removed under this condition, and of course the coupled impedance Z1 and Z2 can be removed too.

In the prior art, merely the diode and the MOS form the voltage-controlled capacitor. Since the voltage-controlled characteristics of the diode and the MOS are mostly decided by semiconductor process parameters, it is hard to adjust characteristics through circuit design and the prior art is unable to provide better voltage-controlled characteristics.

In contrast to the prior art, the present invention calibration method combines diode-varactors and MOS transistor varactors with fixes-capacitance capacitors to generate the required voltage-controlled characteristic. During circuit design, modifying the capacitance of the fixed-capacitor or the bias voltage or other parameters is performed to acquire appropriate and better voltage-controlled characteristics.

Those skilled in the art will readily observe that numerous modifications and alterations of the device may be made while retaining the teachings of the invention. Accordingly, the above disclosure should be constructed as limited only by the metes and bounds of the appended claims.

What is claimed is:

1. A voltage-controlled capacitor circuit having a first output end and a second output end for forming a capacitor between the first output end and the second output end, the voltage-controlled capacitor circuit comprising:

a first varactor having two ends, wherein one end is connected to the first output end; the first varactor comprising a metal oxide semiconductor (MOS) transistor, having a source electrode and a drain electrode that are connected to one end of the first varactor, and a gate electrode that is connected to the other end of the first varactor; a first bias voltage being applied to one end of the first varactor and a first control voltage being applied to the other end of the first varactor; a capacitance between the two ends of the first varactor changing according to a difference between the first bias voltage and the first control voltage; and a second varactor having two ends, wherein one end is connected to the second output end; the second varactor comprising a transistor electrically connected between the two ends of the second varactor for forming a PN-junction between the two ends of the second varactor; a second bias voltage being applied to one end of the second varactor and a second control voltage being applied to the other end of the second varactor; a capacitance between the two ends of the second varactor changing according to a difference between the second bias voltage and the second control voltage.

2. The voltage-controlled capacitor circuit of claim 1 further comprising a capacitor with a constant capacitance electrically connected between one end of the first varactor and the first output end.

3. The voltage-controlled capacitor circuit of claim 1 further comprising a capacitor with a constant capacitance electrically connected between one end of the second varactor and the second output end.

4. The voltage-controlled capacitor circuit of claim 1 further comprising a capacitor with a constant capacitance electrically connected between the second output end and the end that is not connected to the first output end of the first varactor.

5. The voltage-controlled capacitor circuit of claim 1 wherein the first varactor is connected between the first output end and the second output end.

6. The voltage-controlled capacitor circuit of claim 5 further comprising a capacitor with a constant capacitance electrically connected between the first varactor and the second output end.

7. The voltage-controlled capacitor circuit of claim 1 wherein the second varactor is connected between the first output end and the second output end.

8. The voltage-controlled capacitor circuit of claim 7 further comprising a capacitor with a constant capacitance electrically connected between the second output end and the second varactor.

9. The voltage-controlled capacitor circuit of claim 1 wherein the second varactor is connected between the first varactor and the second output end.

10. The voltage-controlled capacitor circuit of claim 9 further comprising a capacitor with a constant capacitance electrically connected between the second varactor and the second output end.

11. The voltage-controlled capacitor circuit of claim 9 wherein the end of the second varactor that has the second control voltage applied is connected to the end of the first varactor that has the first control voltage applied.

12. The voltage-controlled capacitor circuit of claim 1 wherein the voltage level of the first bias voltage is constant.

13. The voltage-controlled capacitor circuit of claim 1 wherein the voltage level of the second bias voltage is constant.

14. The voltage-controlled capacitor circuit of claim 1 wherein the voltage-controlled capacitor circuit is applied to a voltage-controlled oscillator.

15. The voltage-controlled capacitor circuit of claim 14 wherein the voltage-controlled oscillator comprises:
    an inductor electrically connected to the voltage-controlled oscillator;
    an oscillating circuit electrically connected to the inductor for outputting an oscillating signal according to a resonance effect generated between the inductor and the voltage-controlled capacitor circuit.

16. The voltage-controlled capacitor circuit of claim 1 wherein the transistor is a bipolar junction transistor connected as a diode.

17. The voltage-controlled capacitor circuit of claim 1 wherein the transistor is a MOS transistor connected as a diode.

* * * * *